(12) United States Patent
Chen et al.

(10) Patent No.: US 8,101,054 B2
(45) Date of Patent: Jan. 24, 2012

(54) MAGNETIC PARTICLE TRAPPER FOR A DISK SPUTTERING SYSTEM

(75) Inventors: Jinliang Chen, Fremont, CA (US); Kinya Nippa, Sunnyvale, CA (US)

(73) Assignee: WD Media, Inc., San Jose, CA (US)

(*) Notice: Subject to any disclaimer, the term of this patent is extended or adjusted under 35 U.S.C. 154(b) by 421 days.

(21) Appl. No.: 12/474,207

(22) Filed: May 28, 2009

(65) Prior Publication Data
US 2010/0300875 A1    Dec. 2, 2010

(51) Int. Cl.
*C23C 14/34* (2006.01)

(52) U.S. Cl. .............. 204/298.15; 204/298.11; 118/728; 118/729; 118/718; 118/719

(58) Field of Classification Search ............. 204/298.11, 204/298.15; 118/718, 719, 728, 729
See application file for complete search history.

(56) References Cited

U.S. PATENT DOCUMENTS

| | | |
|---|---|---|
| 4,042,128 A | 8/1977 | Shrader |
| 4,500,407 A | 2/1985 | Boys et al. |
| 4,558,388 A | 12/1985 | Graves, Jr. |
| 4,624,617 A | 11/1986 | Belna |
| 4,701,251 A | 10/1987 | Beardow |
| 4,749,465 A | 6/1988 | Flint et al. |
| 5,086,729 A | 2/1992 | Katagiri |
| 5,705,044 A | 1/1998 | Washburn et al. |
| 5,881,649 A | 3/1999 | Hasegawa et al. |
| 6,027,618 A | 2/2000 | Aruga et al. |
| 6,113,169 A | 9/2000 | Gohman et al. |
| 6,228,439 B1 | 5/2001 | Watanabe et al. |
| 6,231,732 B1 | 5/2001 | Hollars et al. |
| 6,251,232 B1 | 6/2001 | Aruga et al. |
| 6,740,209 B2 | 5/2004 | Shibamoto et al. |
| 7,351,292 B2 | 4/2008 | Evers et al. |
| 2003/0033983 A1 | 2/2003 | Song et al. |
| 2008/0264785 A1 | 10/2008 | De Bosscher et al. |

*Primary Examiner* — Rodney McDonald

(57) ABSTRACT

A magnetic particle trapper for use in a sputtering system includes a roller cover plate having a plurality of openings arranged and dimensioned to accommodate a plurality of rollers associated with a mechanical transport mechanism of the sputtering system, and a plurality of magnets to trap magnetic particles, the plurality of magnets being attached to the roller cover plate in locations proximate to the plurality of openings.

13 Claims, 9 Drawing Sheets

Prior Art

MAGNETIC PARTICLE TRAPPER FOR A DISK SPUTTERING SYSTEM

BACKGROUND

A variety of equipment may be used in the manufacture of disk drive media to form the different magnetic and non-magnetic layers. In a typical process, a glass or aluminum substrate travels sequentially through a number of stations at which different materials are deposited under different conditions. For example, one or more sputtering systems may be used to sputter magnetic and/or non-magnetic materials onto the media.

In conventional sputtering processes, active sputtering stations for the media must be separated by finite distances. Without such separation, electromagnetic interference might occur between the stations and result in inhomogeneous sputtering or even equipment failure. Thus, the sputtering stations are physically separated, or, if closely situated, the sputtering stations may not be not used concurrently. Indeed, in some sputtering systems, sputtering components may be shared between adjacent sputtering stations and may be moved back and forth between them as the active sputtering station changes.

Anelva Corporation of Fuchu, Japan produces equipment that may be used to manufacture magnetic recording media such as hard-disks. Anelva supplies a unit designated as the C-3040. The unit includes a main chamber, entrance and output load locks, substrate load and unload stages and a plurality of processing stations. Disks are fed into the system, transported and treated in processing stations, and then are fed from the system as disks ready for use as hard disks in computer applications. Patents describing this system are U.S. Pat. Nos. 6,740,209, 6,027,618, 6,228,439 B1 and 6,251,232 B1.

U.S. Pat. No. 6,740,209 describes an apparatus to be used in manufacturing magnetic recording media. FIG. 1 is a schematic side cross sectional view of the apparatus. FIG. 1 comprises a deposition chamber 1, a substrate holder 90 to locate at least one substrate 9 at a required position in the deposition chamber 1, and multiple cathode units 3 for sputtering discharge.

The deposition chamber 1 is an air-tight vacuum chamber comprising an opening (not shown) for transfer-in-and-out of the substrate 9. The opening is shut and opened by a gate valve (not shown). The deposition chamber 1 comprises a gas introduction line 12 to introduce an argon gas for the sputtering discharge into the inside.

The substrate holder 90 holds the substrate 9 in a vertical position. The substrate holder 90 is capable of holding multiple substrates 9 on the same vertical plane, and at the same height.

FIG. 2 (front view) and FIG. 3 (side view) show schematic views of the substrate holder 90 in the apparatus shown in FIG. 1. As shown in FIG. 2, the substrate holder 90 comprises multiple small "holder magnets" 96 at the bottom. Each holder magnet 96 has a magnetic pole on the top and the bottom. The magnetic poles of the holder magnets 96 are alternatively opposite in the array direction.

Beneath the substrate holder 90, a magnetic-coupling roller 81 is provided, interposing a partition wall 83. The magnetic-coupling roller 81 is a cylinder, on which two spirally elongated magnets 82 are provided as shown in FIG. 2. These magnets 82 are hereinafter called "roller magnets". The surface pole of each roller magnet 82 is opposite to each other. The magnetic-coupling roller 81 has a so-called double-helix structure. The magnetic-coupling roller 81 is provided at a position where the roller magnets 82 face to the holder magnet 96 through the partition wall 83. The partition wall 83 is formed of material that would not disturb the magnetic field, e.g. non-magnetic material. The holder magnets 96 and the roller magnets 82 are magnetically coupled with each other. The magnetic-coupling roller 81 is provided along the transfer line of the substrates 9.

Multiple main pulleys 84 that are rotated around horizontal axes are provided along the transfer line. As shown in FIG. 3, the substrate holder 90 rides on the main pulleys 84. A couple of sub-pulleys 85, 85 are in contact with the lower margin of the substrate holder 90. The sub-pulleys 85, 85 pinch the lower margin of the substrate holder 90 to prevent the substrate holder 90 from falling. The multiple sub-pulleys 85, 85 are provided along the transfer line as well.

As shown in FIG. 3, a drive rod 86 is connected with the magnetic-coupling roller 81 through a bevel gear. A motor 87 is connected with the drive rod 86 so that the magnetic-coupling roller 81 can be rotated around its center axis by driving force transferred from the motor 87 through the drive rode 86. When the magnetic-coupling roller 81 is rotated, the double-helix roller magnets 82 shown in FIG. 2 are also rotated. When the roller magnets 82 are rotated the plural aligned small magnets of which poles are alternately opposite move simultaneously along the aligning direction. Therefore, the holder magnets 96 magnetically coupled with the roller magnets 82 also move linearly as the roller magnets 82 are rotated, resulting in the substrate holder 90 moving linearly as well. During this liner movement, the main pulleys 84 and the sub-pulleys 85, 85 shown in FIG. 3 are driven to rotate, following the movement.

Unfortunately, physical or temporal separation of processing stations results in having to transport disks using such above described mechanical transport systems including disk carrying devices. Such mechanical transport systems are susceptible to mechanical wear which in turn produces contamination byproducts. The friction coefficient in a drive mechanism can be large and a lubricant cannot be used due to the vacuum requirements. For example, the main pulleys 84 and the sub-pulleys 85 shown in FIG. 3 are susceptible to mechanical wear and produce contamination byproducts.

The contamination byproducts may take on the form of magnetic metal debris or ferrous metal debris (magnetic particles). These magnetic particles cause contamination of target materials and cause voids in the deposited films which can lower the yield and throughput in the manufacturing of magnetic media. An object of the present invention is to provide a magnetic particle trapper device to capture the magnetic particles to reduce the target contamination and reduce the voids in the depositing films from such magnetic particles. There is therefore a need for an improved mechanical transport system having at least one magnetic particle trapper device.

DETAILED DESCRIPTION

Embodiments of the present invention are directed to a magnetic particle trapper. The function of the magnetic particle trapper is to trap contamination byproducts that may take on the form of magnetic metal debris or ferrous metal debris (magnetic particles) generated by a disk transport system used in a sputtering system.

Figure 1:
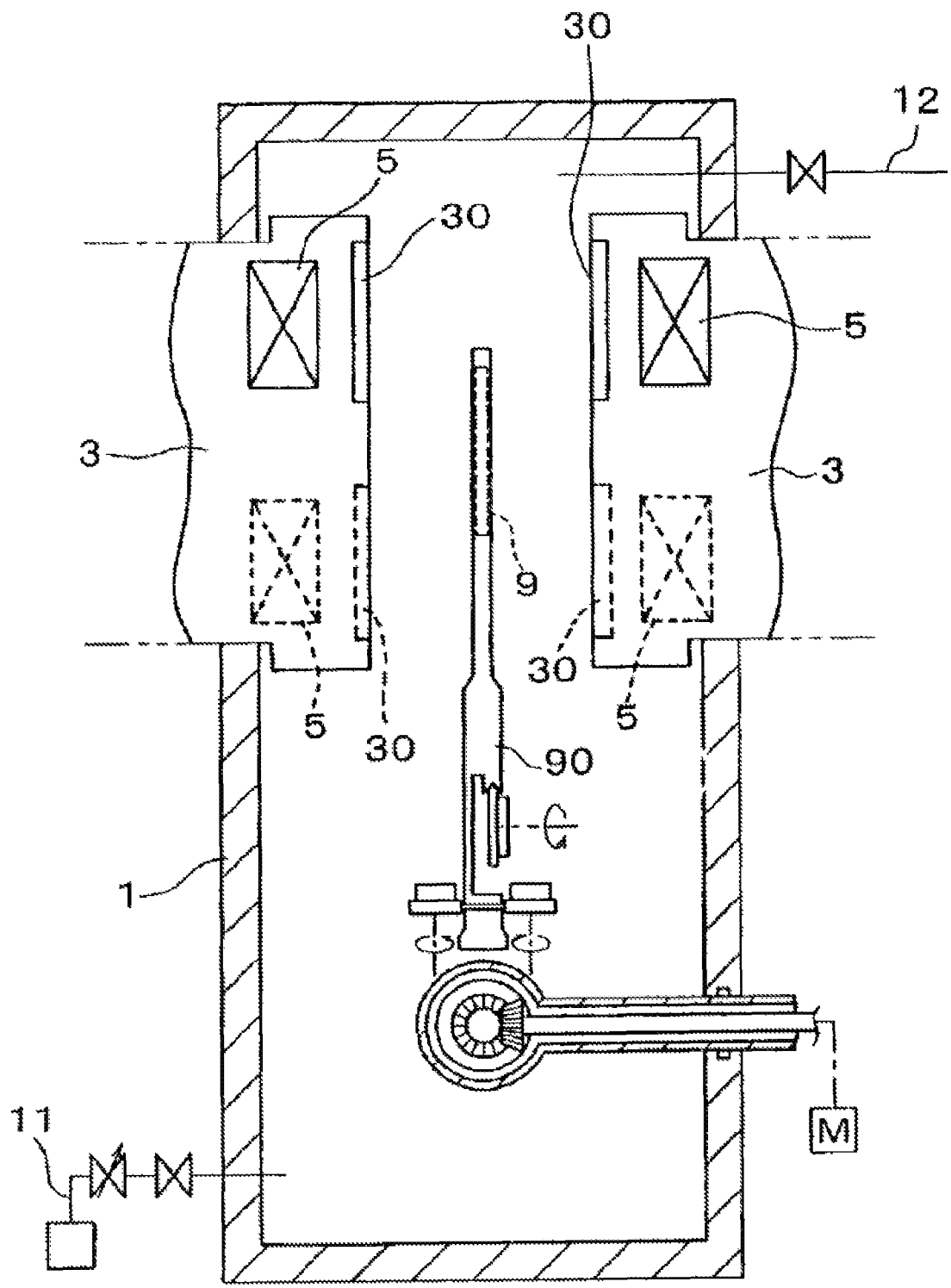
FIG. 1 is a cross-sectional, schematic view illustrating an prior art sputtering system including a substrate holder and mechanical drive system.
Figure 2:
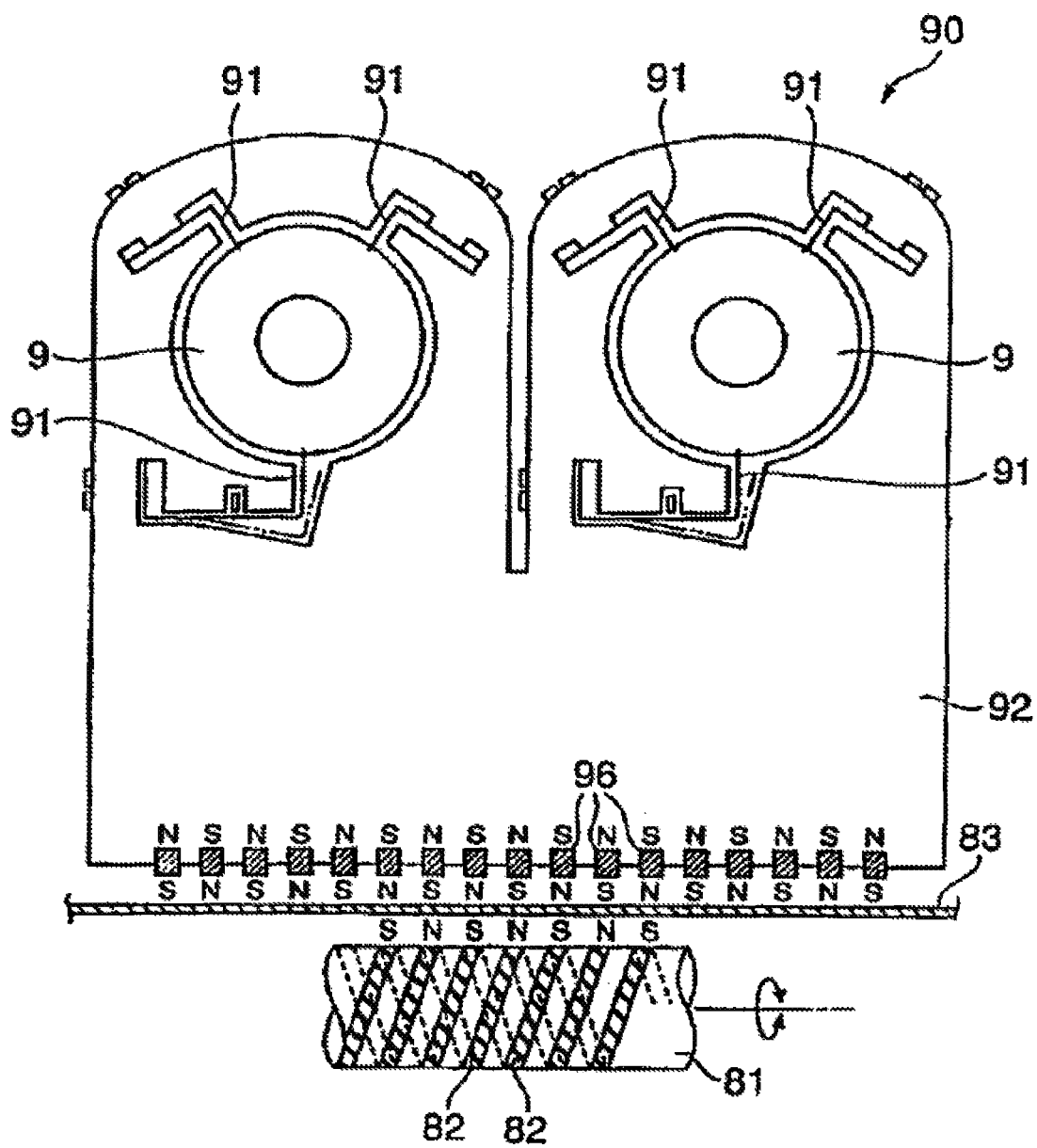
FIG. 2 is a front, schematic view illustrating a prior art substrate holder and mechanical drive system.
Figure 3:
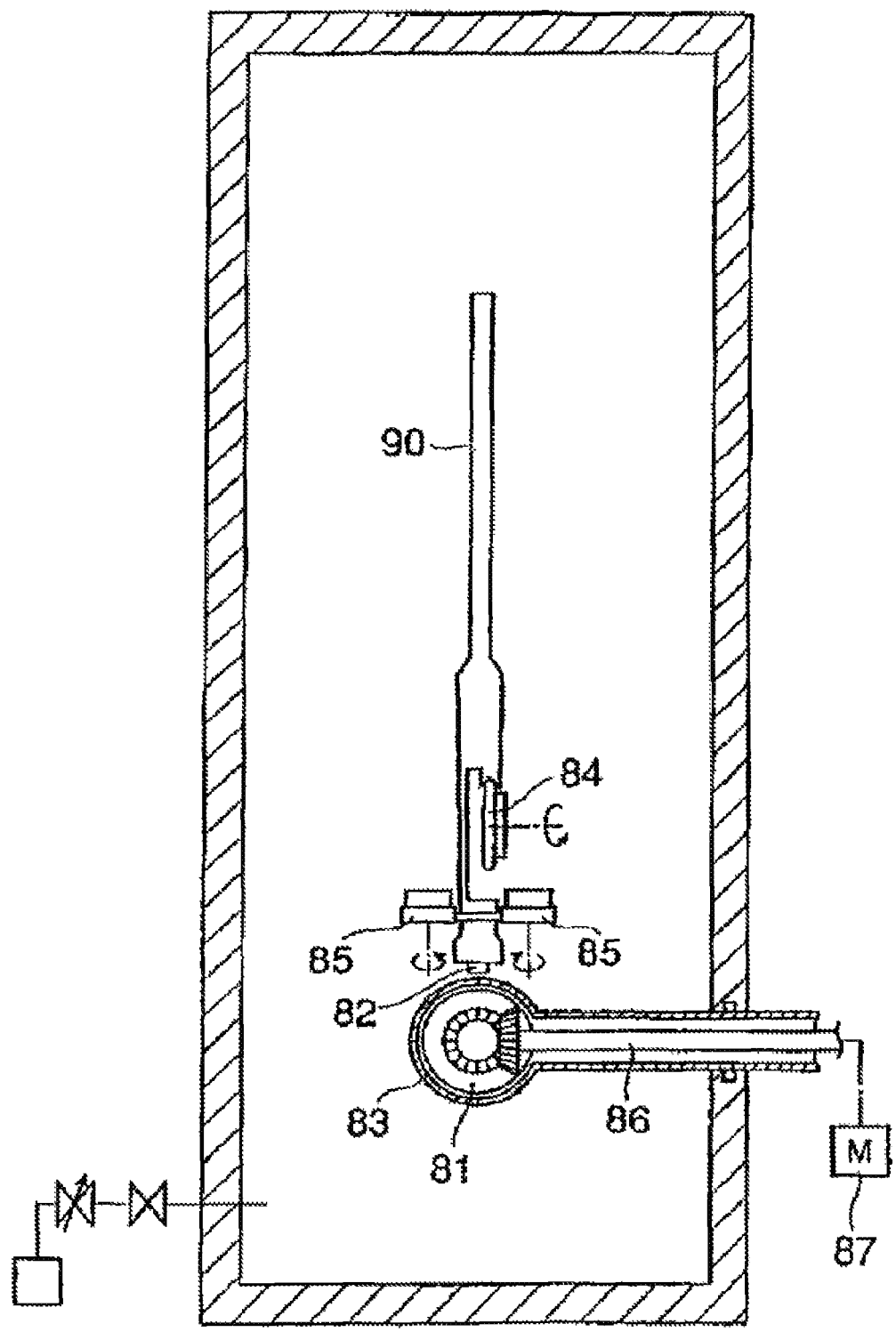
FIG. 3 is a side, schematic view illustrating a prior art substrate holder and mechanical drive system.
Figure 4:
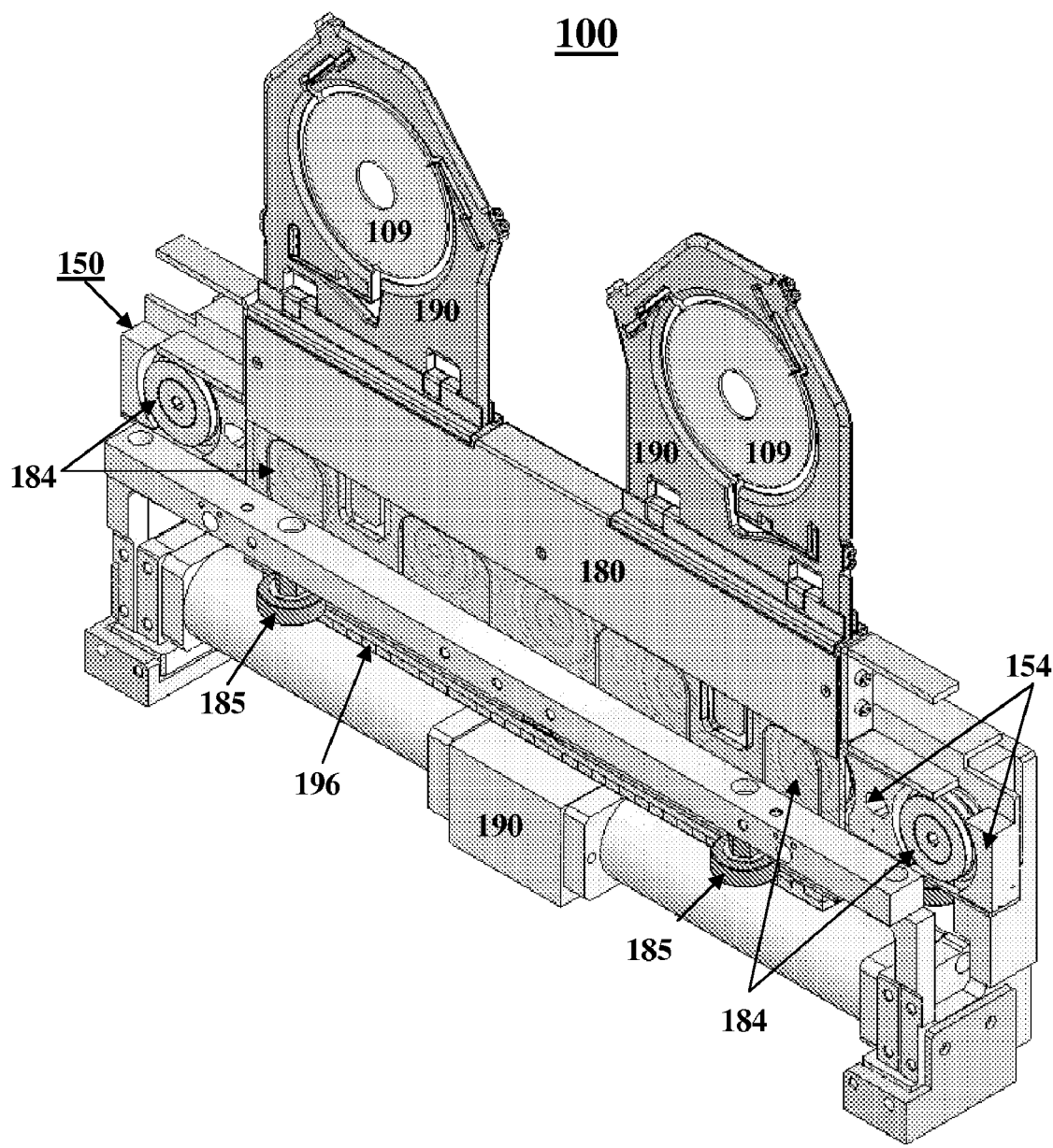
FIG. 4 is a schematic view illustrating an exemplary disk transport system, according to one embodiment.
Figure 5:
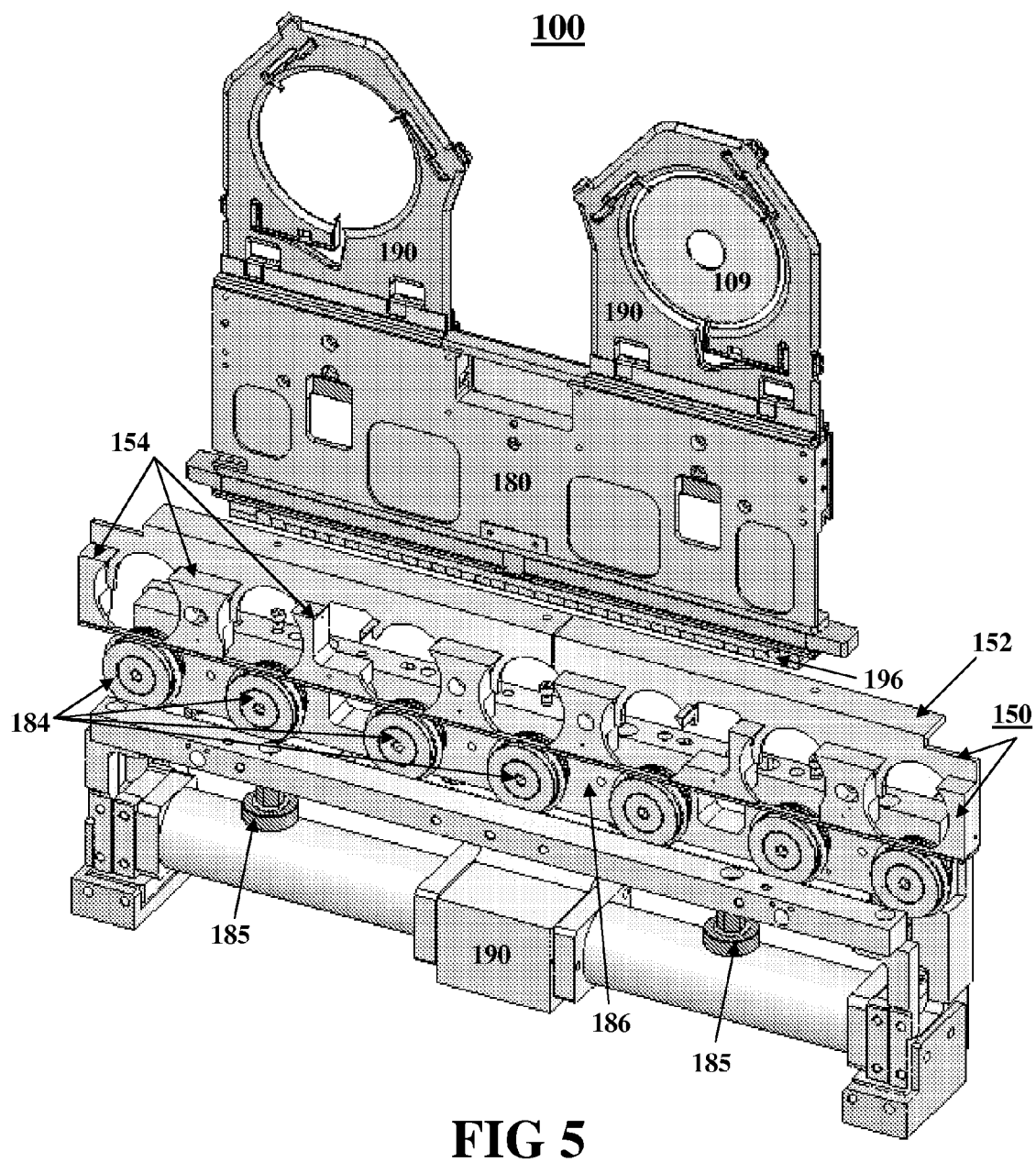
FIG. 5 is an exploded view of the disk transport system of FIG. 4, according to one embodiment.
Figure 6:
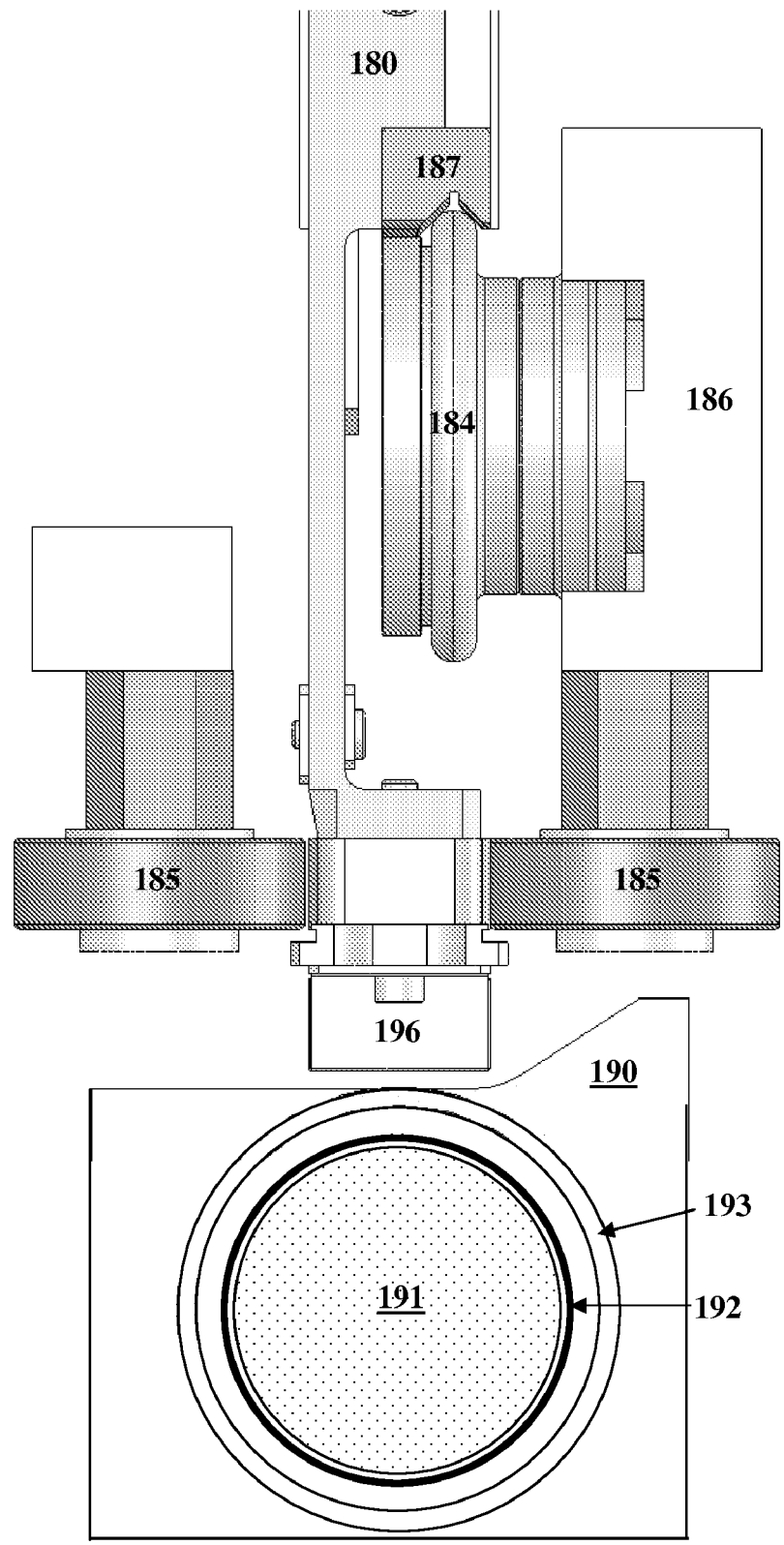
FIG. 6 is a schematic view illustrating a guide roller and sub-rollers arrangement of an exemplary disk transport system, according to one embodiment.

Referring to FIGS. 4, 5, and 6, an exemplary disk transport system 100 is illustrated, according to one embodiment. The purpose of the disk transport system 100 is to transport disks 109 held in substrate holders 190 in a linear direction along a horizontal transfer line. A plurality of disk transport systems 100 may be used in a sputtering system to transport disks 109.

The disk transport system 100 includes a pair of substrate holders 190, a substrate holder support panel 180, a plurality of holder magnets 196 coupled to the bottom side of the substrate holder support panel 180, a plurality of main guide rollers 184 and a plurality of sub-rollers 185 coupled to a roller support panel 186, a magnetic drive unit 190, and a magnetic particle trapper 150.

The magnetic particle trapper 150 need not be restricted to use in disk transport systems utilizing magnetic drive units. The magnetic particle trapper 150, and versions thereof, can also be used in any disk transport systems that utilize moving mechanical parts, pulleys, sub-pulleys, guide rollers, sub-rollers, gears, rack and pinion, rails, guides, etc., that are subject to mechanical wear and produce contamination byproducts that may take on the form of magnetic metal debris or ferrous metal debris (magnetic particles).

Figure 7:
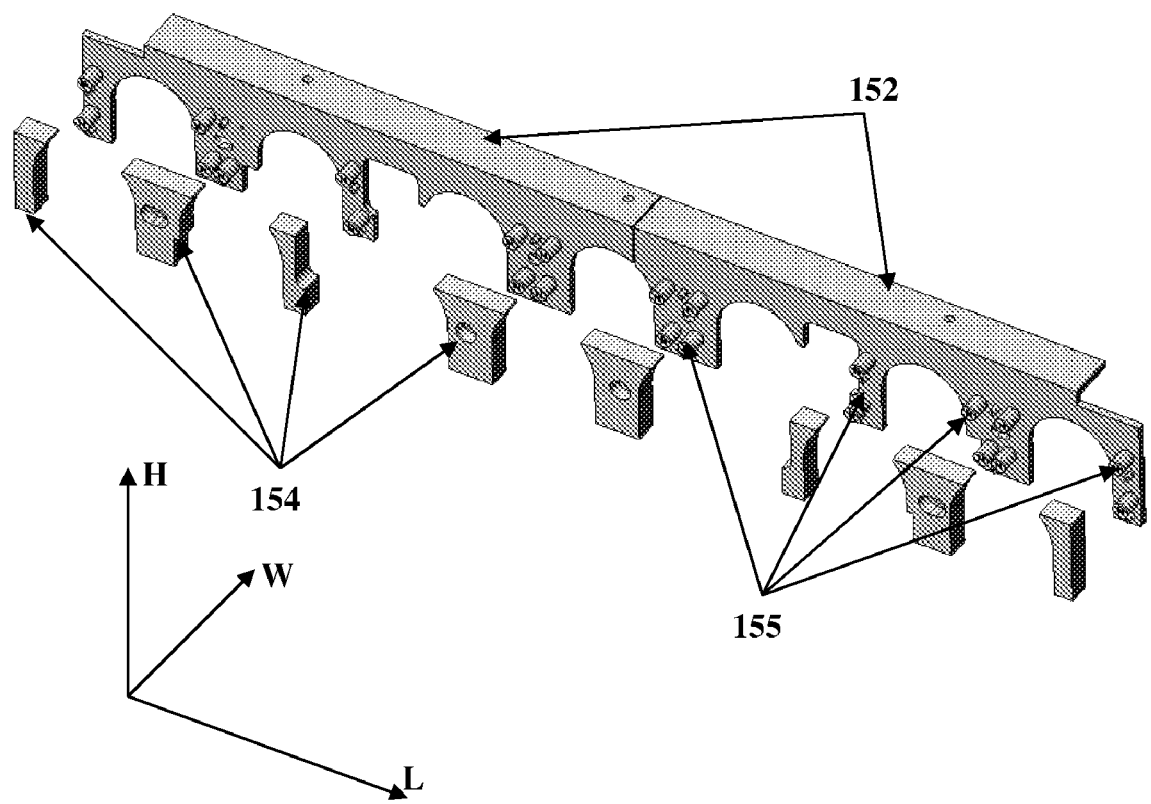
FIG. 7 is a schematic view illustrating a multiple piece magnetic particle trapper, according to one embodiment.

Referring to FIG. 7, in the illustrated embodiment, the magnetic particle trapper 150 may include a roller cover plate 152, a plurality of roller shields 154, and a plurality of permanent magnets 155. In this embodiment, permanent magnets 155 are attached to roller cover plate 152, and roller shields 154 are mounted to roller cover plate 152 to cover permanent magnets 155.

The roller cover plate 152 is removeably mounted to the disk transport system 100 having the plurality of main guide rollers 184. The roller cover plate 152 may be shaped like an inverted capital letter "L". The roller cover plate 152 length (L) is greater than the height (H), and the height (H) is greater the width (W). The roller cover plate 152 may have seven semi-circular or semi-oval openings to accommodate the seven main guide rollers 184 associated with the disk transport system 100 of the sputtering system.

The magnetic particle trapper 150 utilizes the plurality of permanent magnets 155 to trap magnetic metal debris or ferrous metal debris (magnetic particles). The permanent magnets 155 of magnetic particle trapper 150 are strategically located in proximity to the plurality of main guide rollers 184 and the plurality of sub-rollers 185 coupled to the roller support panel 186. The plurality of main guide rollers 184 and the plurality of sub-rollers 185 are believed to be a primary source of magnetic metal debris or ferrous metal debris (magnetic particles).

Figure 8:
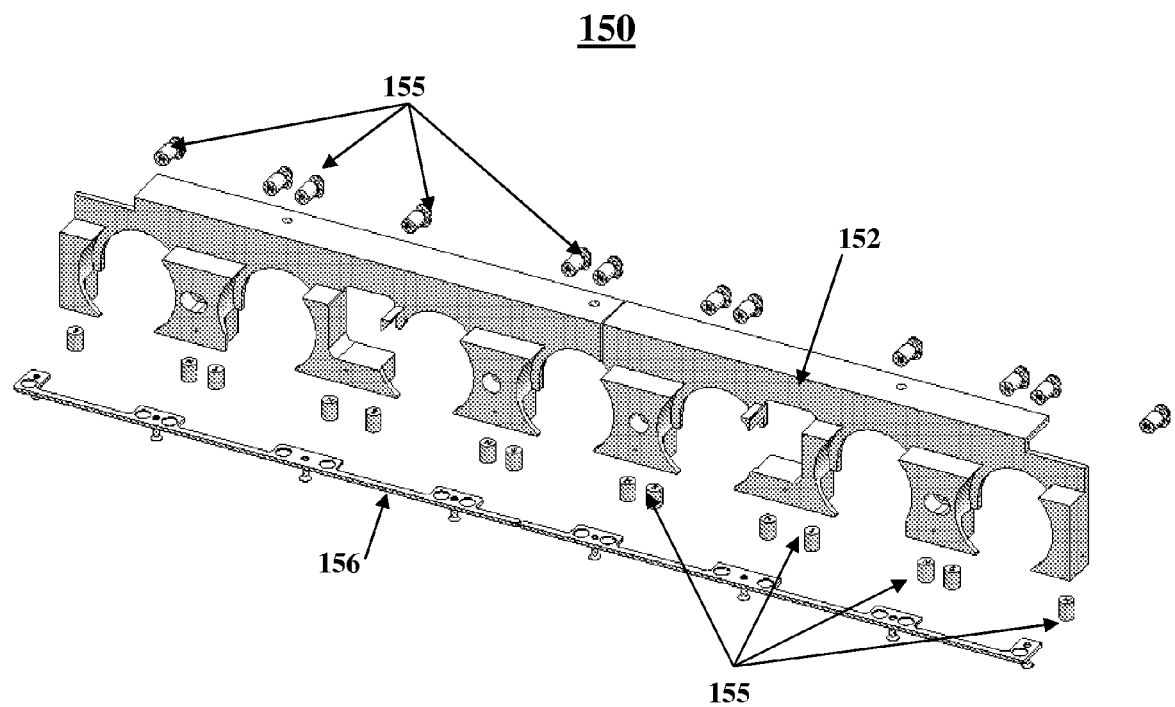
FIG. 8 is a schematic view illustrating an alternative two piece magnetic particle trapper, according to one embodiment.

A second embodiment of the invention is illustrated in FIG. 8, the magnetic particle trapper 150 may include roller shields that are integral to a roller cover plate 152, a bottom shield 156, and a plurality of permanent magnets 155. In this embodiment, permanent magnets 155 are inserted into roller cover plate 152. Bottom shield 156 is then attached to the bottom of roller cover plate 152.

Figure 9:
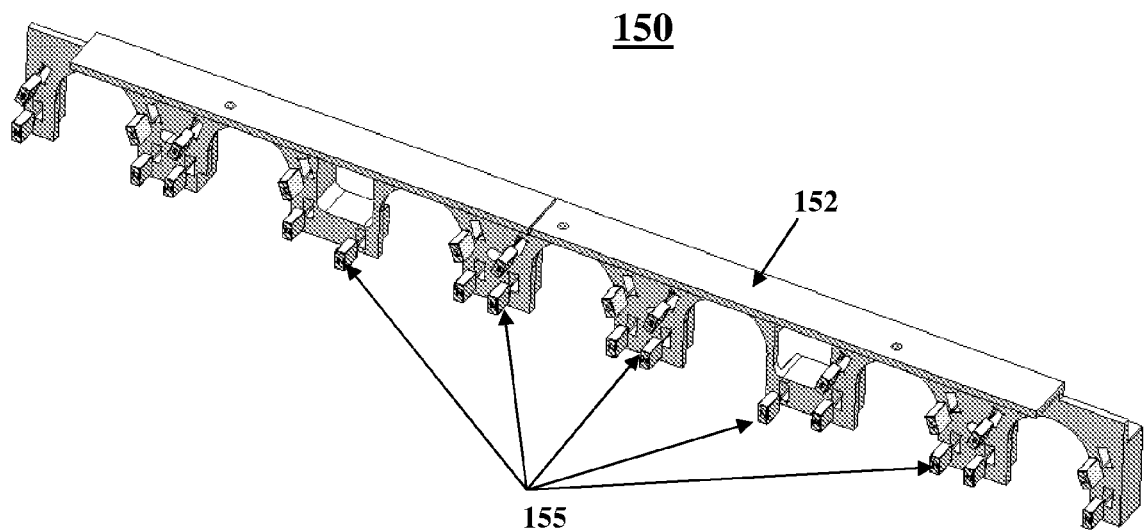
FIG. 9 is a schematic view illustrating an alternative one piece magnetic particle trapper, according to one embodiment.

A third embodiment of the invention is illustrated in FIG. 9, the magnetic particle trapper 150 may include roller shields that are integral to a roller cover plate 152. In this embodiment, a plurality of permanent magnets 155 are inserted into roller cover plate 152. The permanent magnets 155 are rectangular shaped to increase the effective magnetic field produced by the magnets. As illustrated, the upper row of magnets are mounted such that the south pole faces outward while the lower row of magnets are mounted such that the north pole faces outward. This arrangement allows the magnetic field to loop from the north pole to the south pole of adjacent magnet pairs. The looping magnetic field attracts and collects stray magnetic particles produced by the main guide rollers 184 and the sub-rollers 185. One purpose of the specific magnetic orientation of the magnets is to minimize eddy currents that may affect the sputtering process.

The permanent magnets 155 for all embodiments may be made from magnetic alloys including at least one metal from the group consisting of Neodymium, Iron, Boron, Samarium, and Cobalt.

The permanent magnets 155 could each be a simple magnet, stacked magnets or any format of the combinations. The material of magnets is preferably, but not limited to, a Samarium and Cobalt alloy (Sm—Co). The material of the roller cover plate 152 and the roller shields 154 is preferably, but not limited, aluminum. The material of the roller bottom shield 156 is preferably, but not limited, 400 series stainless steel.

Disk transport system 100 is utilized to transport disks 109 held in substrate holders 190 in a linear direction along a horizontal transfer line. As shown in FIGS. 4, 5, and 6, the substrate holder support panel 180 includes an array of multiple small permanent holder magnets 196 mounted along a bottom surface thereof. Each permanent holder magnet 96 has a magnetic pole on the top and the bottom surfaces. The magnetic poles of the holder magnets 96 are alternatively oppositely directed in the array direction (horizontal transfer line). For example, the first magnet in the magnet array 196 (depicted at the far left of FIG. 4) may be oriented north up and south down, the second magnet may be oriented south up and north down, etc.

Beneath the substrate holder support panel 180 resides the magnetic drive unit 190. Various magnetic drive units for use in disk transport systems are described in the prior art. Magnetic drive unit 190 is similar to the magnetic drive unit disclosed in U.S. Pat. No. 6,740,209. Referring to FIG. 6, the magnetic drive unit 190 further includes a motor (not shown), and a magnetic-coupling roller 191. The magnetic-coupling roller 191 may be provided within a partition cylinder 193 of the magnetic drive unit 190. The magnetic-coupling roller 191 is a cylinder, on which roller magnets 192 are provided. The surface pole of each of roller magnets 192 are opposite to each other. The magnetic-coupling roller 191 may have a so-called double-helix structure. The magnetic-coupling roller 191 is provided at a position where the roller magnets 192 face towards the holder magnets 196 through the partition cylinder 193 of the magnetic drive unit 190. The partition cylinder 193 is formed of a material that would not disturb the magnetic field, e.g. non-magnetic material. The holder magnets 196 and the roller magnets 192 are magnetically coupled with each other. The magnetic-coupling roller 191 is provided along the horizontal transfer line of the substrates 9 parallel to the holder magnets 196 attached to the bottom surface of the substrate holder support panel 180.

As shown in FIGS. 4 and 5, a plurality of main guide rollers 184 are coupled to a roller support panel 186. Main guide rollers 184 rotate around horizontal axes and are provided along the horizontal transfer line. Referring to FIG. 6, a V-shaped rail 187 attached to a lower surface of the substrate holder support panel 180 makes contact with the plurality of main guide rollers 184 as the substrate holder support panel 180 and substrate holders 190 ride on the main guide rollers 184. A plurality of sub-rollers 185 are in contact with the lower margin of the substrate holder support panel 180. The sub-rollers 185 pinch the lower margin of the substrate holder support panel 180 to prevent the substrate holder support panel 180 and substrate holders 190 from deviating from a substantially vertical position. The multiple sub-rollers 185 are provided along the horizontal transfer line as well.

The motor is connected to the magnetic-coupling roller 191 so that the magnetic-coupling roller 191 can be rotated around its center axis by driving force transferred from the motor. When the magnetic-coupling roller 191 is rotated, the roller magnets 192 are also rotated. When the roller magnets 192 are rotated the plural aligned holder magnets 196 of which poles are alternately opposite move simultaneously along the aligning direction. Therefore, the holder magnets 196 magnetically coupled with the roller magnets 192 also move linearly as the roller magnets 192 are rotated, resulting in the substrate holder support panel 180 and substrate holders 190 moving linearly together as well. During this liner movement, the main rollers 184 and the sub-rollers 185 shown in FIGS. 4, 5, and 6 are driven to rotate, following the movement. The main rollers 184 and the sub-rollers 185 are believed to be a primary source of magnetic metal debris or ferrous metal debris (magnetic particles).

The magnetic particle trapper 150 as shown in FIGS. 7-9 utilize magnetic fields generated by the plurality of permanent magnets 155 to trap magnetic metal debris or ferrous metal debris (magnetic particles). The permanent magnets 155 of magnetic particle trapper 150 are strategically located in proximity to the plurality of main guide rollers 184 and the plurality of sub-rollers 185 coupled to the roller support panel 186.

The magnetic particle trapper 150 need not be restricted to use in disk transport systems utilizing magnetic drive units. The magnetic particle trapper 150, and versions thereof, can also be used in any disk transport systems that utilize moving mechanical parts, pulleys, sub-pulleys, guide rollers, sub-rollers, gears, rack and pinion, rails, guides, etc., that are subject to mechanical wear and produce contamination byproducts that may take on the form of magnetic metal debris or ferrous metal debris (magnetic particles).

It should be appreciated by those with skill in this art that, although embodiments of the invention have been previously described with reference to particular disk transport systems, that the embodiments of the invention may be utilized with a wide variety of differing types of disk transport systems having different types of moving mechanical parts, pulleys, sub-pulleys, guide rollers, sub-rollers, gears, rack and pinion, etc., and that the details disclosed in describing the embodiments of the invention are not intended to limit the scope of the invention as set forth in the appended claims.

In the foregoing specification, embodiments of the invention have been described with reference to specific exemplary features thereof. It will, however, be evident that various modifications and changes may be made thereto without departing from the broader spirit and scope of the invention as set forth in the appended claims. The specification and figures are, accordingly, to be regarded in an illustrative rather than a restrictive sense.

We claim:

1. A magnetic particle trapper for use in a sputtering system, comprising:
   a roller cover plate having a plurality of openings arranged and dimensioned to accommodate a plurality of rollers associated with a mechanical transport mechanism of the sputtering system; and
   a plurality of magnets to trap magnetic particles, the plurality of magnets being attached to the roller cover plate in locations proximate to the plurality of openings.

2. The magnetic particle trapper of claim 1, further comprising a plurality of roller shields attached to the roller cover plate in locations adjacent to the plurality of openings, each roller shield to cover at least one of the plurality of magnets.

3. The magnetic particle trapper of claim 1, wherein the roller cover plate includes a plurality of vertical walls to form the plurality of openings to accommodate the plurality of rollers.

4. The magnetic particle trapper of claim 3, wherein the plurality of magnets are attached to the plurality of vertical walls.

5. The magnetic particle trapper of claim 3, wherein the plurality of roller shields are attached to the plurality of vertical walls in locations adjacent to the plurality of openings, each roller shield to cover at least one of the plurality of magnets.

6. The magnetic particle trapper of claim 1, wherein the plurality of openings includes a plurality of semi-circular openings.

7. The magnetic particle trapper of claim 1, wherein the plurality of openings includes a plurality of semi-oval openings.

8. The magnetic particle trapper of claim 1, wherein the magnetic particle trapper includes a bottom shield attached to the roller cover plate.

9. The magnetic particle trapper of claim 7, wherein the bottom shield has a plurality of openings to accommodate at lease one of the plurality of magnets.

10. The magnetic particle trapper of claim 1, wherein the plurality of magnets includes permanent magnets made from magnetic alloys including at least one metal selected from the group consisting of Neodymium, Iron, Boron, Samarium, and Cobalt.

11. The magnetic particle trapper of claim 1, wherein the roller cover plate is removeably mounted to the mechanical transport mechanism having the plurality of rollers.

12. The magnetic particle trapper of claim 1, wherein the roller cover plate is shaped like an inverted letter "L", the length is greater than the height, and the height is greater the width.

13. The magnetic particle trapper of claim 12, wherein the roller cover plate has seven openings to accommodate seven rollers associated with the mechanical transport mechanism of the sputtering system.

* * * * *